(12) United States Patent
Gopalakrishnan et al.

(10) Patent No.: US 7,733,815 B2
(45) Date of Patent: Jun. 8, 2010

(54) DATA SAMPLER INCLUDING A FIRST STAGE AND A SECOND STAGE

(75) Inventors: Karthik Gopalakrishnan, San Jose, CA (US); Luca Ravezzi, San Jose, CA (US); Sivaraman Chokkalingam, San Jose, CA (US); Edoardo Prete, Münuchen (DE); Hamid Partovi, San Jose, CA (US)

(73) Assignee: Qimonda AG, Munich (DE)

( * ) Notice: Subject to any disclaimer, the term of this patent is extended or adjusted under 35 U.S.C. 154(b) by 858 days.

(21) Appl. No.: 11/494,848

(22) Filed: Jul. 28, 2006

(65) Prior Publication Data
US 2008/0024215 A1   Jan. 31, 2008

(51) Int. Cl.
*H04B 3/52* (2006.01)
*H03F 3/04* (2006.01)
(52) U.S. Cl. ........................... 370/284; 330/250
(58) Field of Classification Search ................ 370/235, 370/284
See application file for complete search history.

(56) References Cited

U.S. PATENT DOCUMENTS

| 5,015,876 | A | 5/1991 | Knudesen |
| 2003/0058046 | A1* | 3/2003 | Moon .................... 330/250 |
| 2005/0018799 | A1 | 1/2005 | Boerstler et al. |
| 2005/0069070 | A1 | 3/2005 | Paillet et al. |
| 2005/0128841 | A1 | 6/2005 | Kim |

* cited by examiner

*Primary Examiner*—Huy D Vu
*Assistant Examiner*—Stephen J Clawson
(74) *Attorney, Agent, or Firm*—Dicke, Billig & Czaja, PLLC

(57) ABSTRACT

A data sampler including a first stage and a second stage. The first stage is configured to receive differential signals and provide a first edge rate in a first output signal and a second edge rate in a second output signal based on the differential signals. The second stage is configured to amplify the difference between the first output signal and the second output signal to provide regenerated output signals. The second stage provides a third edge rate in a first internal signal and a fourth edge rate in a second internal signal based on the first edge rate and the second edge rate.

21 Claims, 5 Drawing Sheets

DATA SAMPLER INCLUDING A FIRST STAGE AND A SECOND STAGE

BACKGROUND

Typically, a computer system includes a number of integrated circuits that communicate with one another to perform system applications. Often, the computer system includes one or more host controllers and one or more electronic subsystem assemblies, such as a dual in-line memory module (DIMM), a graphics card, an audio card, a facsimile card, and a modem card. To perform system functions, the host controller(s) and subsystem assemblies communicate via communication links, such as serial communication links and parallel communication links. Serial communication links include links that implement the fully buffered DIMM (FB-DIMM) advanced memory buffer (AMB) standard, the peripheral component interconnect express (PCIe) standard, and any other suitable serial communication link interface.

An AMB chip is a key device in a FB-DIMM. The AMB has two serial links, one for upstream traffic and the other for downstream traffic, and a bus to on-board memory, such as dynamic random access memory (DRAM) in the FB-DIMM. Serial data from the host controller sent through the downstream serial link (southbound) is temporarily buffered, and then sent to memory in the FB-DIMM. The serial data contains the address, data, and command information given to the memory, converted in the AMB, and sent out to the memory bus. The AMB writes in and reads out from the memory as instructed by the host controller. The read data is converted to serial data, and sent back to the host controller on the upstream serial link (northbound).

The AMB also performs as a repeater between FB-DIMMs on the same channel. The AMB transfers information from a primary southbound link connected to the host controller or an upper AMB to a lower AMB in the next FB-DIMM via a secondary southbound link. The AMB receives information in the lower FB-DIMM from a secondary northbound link, and after merging the information with information of its own, sends it to the upper AMB or host controller via a primary northbound link. This forms a daisy-chain among FB-DIMMs. A key attribute of the FB-DIMM channel architecture is the high-speed, serial, point-to-point connection between the host controller and FB-DIMMs on the channel. The AMB standard is based on serial differential signaling.

PCIe is also a high-speed, serial link that communicates data via differential signal pairs. A PCIe link is built around a bidirectional, serial, point-to-point connection known as a "lane". At the electrical level, each lane utilizes two unidirectional low voltage differential signaling pairs, a transmit pair and a receive pair, for a total of 4 data wires per lane. A connection between any two PCIe devices is known as a link, and is built up from a collection of 1 or more lanes. All PCIe devices minimally support single-lane (x1) links. Devices may optionally support wider links composed of x2, x4, x8, x12, x16, x32, or more lanes.

High speed communication links, such as AMB and PCIe, often use ground referenced signals, such as current mode logic (CML) signals, to communicate data. The data signals are sampled via data sampling circuits, referred to as data samplers, to recover the data. Typically, the data samplers are n-channel metal oxide semiconductor (NMOS) based circuits and level shifters are used to elevate the common mode level of the ground referenced signals for sampling via the NMOS based data samplers. The level shifters use power, in addition to the power used by the NMOS based data samplers. Manufacturers are continually looking for ways to reduce power consumption, especially in low voltage and/or low power applications.

For these and other reasons there is a need for the present invention.

SUMMARY

One aspect of the present invention provides a data sampler including a first stage and a second stage. The first stage is configured to receive differential signals and provide a first edge rate in a first output signal and a second edge rate in a second output signal based on the differential signals. The second stage is configured to amplify the difference between the first output signal and the second output signal to provide regenerated output signals. The second stage provides a third edge rate in a first internal signal and a fourth edge rate in a second internal signal based on the first edge rate and the second edge rate.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
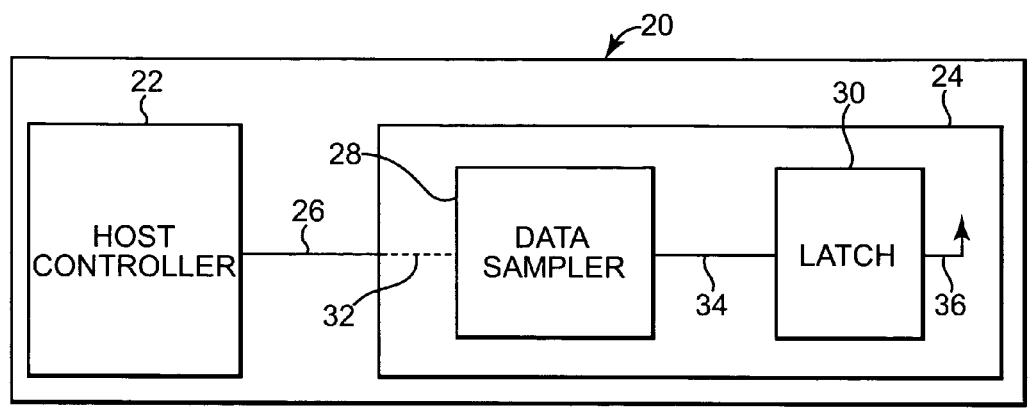
FIG. 1 is a diagram illustrating one embodiment of a computer system according to the present invention.

FIG. 1 is a diagram illustrating one embodiment of a computer system 20 according to the present invention. Computer system 20 includes a host controller 22 and a subsystem assembly 24. Host controller 22 is electrically coupled to subsystem assembly 24 via communications link 26. Host controller 22 controls subsystem assembly 24 via communications link 26 to provide a system function. In one embodiment, host controller 22 is a memory controller. In one embodiment, subsystem assembly 24 is an FB-DIMM and host controller 22 controls the FB-DIMM to provide a system memory function. In other embodiments, subsystem assembly 24 is any suitable subsystem assembly, such as a graphics card, an audio card, a facsimile card, or a modem card, and host controller 22 controls subsystem assembly 24 to provide the corresponding system function.

Subsystem assembly 24 includes a data sampler 28 and a latch 30. Data sampler 28 is electrically coupled to host controller 22 via communications link 26 and data communications path 32. In one embodiment, data communications path 32 includes one or more buffers that receive signals from host controller 22 via communications link 26 and provide buffer signals to data sampler 28. In one embodiment, data communications path 32 includes one or more CML buffers that receive CML signals from host controller 22 via communications link 26 and provide CML buffer signals to data sampler 28. In other embodiments, data communications path 32 includes any suitable circuitry that receives signals from host controller 22 via communications link 26 and provides signals to data sampler 28. In other embodiments, data communications path 32 does not include any other circuit(s).

Data sampler 28 is configured to receive signals that have a low common mode level, such as CML signals and other ground referenced signals. Level shifters are not needed to raise the common mode level of the low common mode level signals before being received by data sampler 28. Thus, data sampler 28 reduces power needs and is especially useful in low voltage and/or low power applications.

Data sampler 28 is electrically coupled to latch 30 via regenerated output signal path 34. Latch 30 is electrically coupled to circuitry in subsystem assembly 24 via data output path 36. Data sampler 28 receives signals from host controller 22 via communications link 26 and data communications path 32 and provides regenerated output signals to latch 30 via regenerated output signal path 34. Latch 30 receives the regenerated output signals and provides latched data in data output signals to subsystem assembly 24 via data output path 36.

In one embodiment, communications link 26 includes one or more differential signal pairs that communicate data between host controller 22 and subsystem assembly 24. In one embodiment, communications link 26 includes one differential signal pair. In one embodiment, communications link 26 includes multiple differential signal pairs that communicate data bi-directionally via communications link 26.

In one embodiment, subsystem assembly 24 is an FB-DIMM that is one of multiple FB-DIMMs daisy-chained to host controller 22 via communications link 26. Each of the daisy-chained FB-DIMMs includes an AMB that provides an AMB serial communications link. The AMB serial communications link includes CML signals in differential pairs in communications link 26. Each of the FB-DIMMs includes one or more data samplers 28 that receive the CML signals via the differential pairs in communications link 26 and provide regenerated output signals to corresponding latches 30. The latches 30 provide data output signals to the AMB and FB-DIMM subsystem assembly 24.

In one embodiment, host controller 22 and subsystem assembly 24 provide a PCIe serial communications link in communications link 26. The PCIe serial communications link is an AC-coupled interface that includes CML signals in differential pairs in communications link 26. Each subsystem assembly 24 includes one or more data samplers 28 that receive the CML signals via the differential pairs in communications link 26 and provide regenerated output signals to corresponding latches 30. The latches 30 provide data output signals to subsystem assembly 24. In other embodiments, host controller 22 and subsystem assembly 24 communicate via any suitable communications link.

Figure 2:
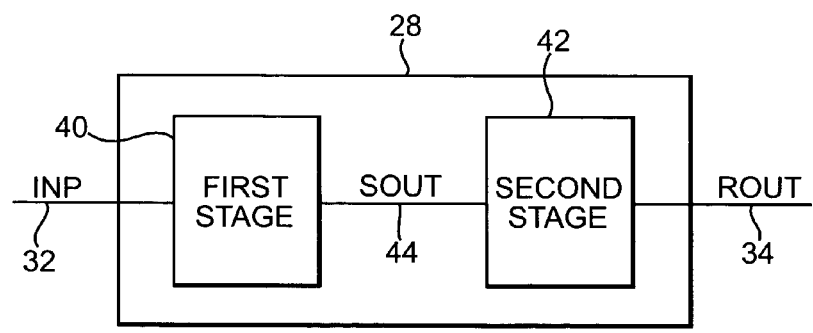
FIG. 2 is a diagram illustrating one embodiment of a data sampler.

FIG. 2 is a diagram illustrating one embodiment of data sampler 28, which receives input signals IP via data communications path 32 and provides regenerated output signals ROUT via regenerated output signal path 34. Data sampler 28 includes a first stage 40 that is electrically coupled to a second stage 42 via output signal path 44. First stage 40 is electrically coupled to other circuits, such as host controller 22, via data communications path 32. Second stage 42 is electrically coupled to other circuits, such as latch 30, via regenerated output signal path 34.

First stage 40 is a clocked amplifier that receives input signals INP at 32 and samples the received input signals INP at 32 to recover data, such as address data, write data, command data, and/or a clock. First stage 40 is configured to receive low common mode level input signals INP at 32 and provide output signals SOUT to second stage 42 via output signal path 44. Output signals SOUT at 44 include the data information obtained via sampling the received input signals INP at 32. Second stage 42 is a regenerative structure that receives output signals SOUT at 44 and provides regenerated output signals ROUT at 34. In one embodiment, the regenerated output signals ROUT at 34 have a higher common mode level than input signals INP at 32. In one embodiment, the regenerated output signals ROUT at 34 can be used in a clock recovery system. In one embodiment, first stage 40 is a clocked p-channel metal oxide semiconductor (PMOS) amplifier.

In one embodiment, first stage 40 receives differential input signals INP at 32 and provides two output signals SOUT at 44. First stage 40 provides a first edge rate in one of the two output signals SOUT at 44 and a second edge rate in the other of the two output signals SOUT at 44. The first edge rate and the second edge rate are based on the difference between the differential input signals INP at 32. Second stage 42 receives the two output signals SOUT at 44 and provides a third edge rate in a first internal signal and a fourth edge rate in a second internal signal based on the difference between the first edge rate and the second edge rate. Second stage 42 amplifies the difference between the two output signals SOUT at 44 and provides regenerated output signals ROUT at 34.

In one embodiment, first stage 40 receives differential input signals INP at 32 and provides two output signals SOUT at 44 based on the differential input signals INP at 32. Second stage 42 receives the two output signals SOUT at 44 and provides a first internal signal and a second internal signal based on the two output signals SOUT at 44. First stage 40 pre-charges the two output signals SOUT at 44 toward or substantially to a first voltage during one state of a clock signal. This automatically forces the second stage 42 to pre-charge the first internal signal and the second internal signal toward or substantially to a second voltage during this phase of the clock signal. During the opposite phase of the clock signal, first stage 40 samples input signals INP at 32 and provides a transition in the two output signals SOUT at 44.

Second stage 42 transitions the first and second internal signals based on the transition rates of the two output signals SOUT at 44 to provide regenerated output signals ROUT at 34.

Figure 3:
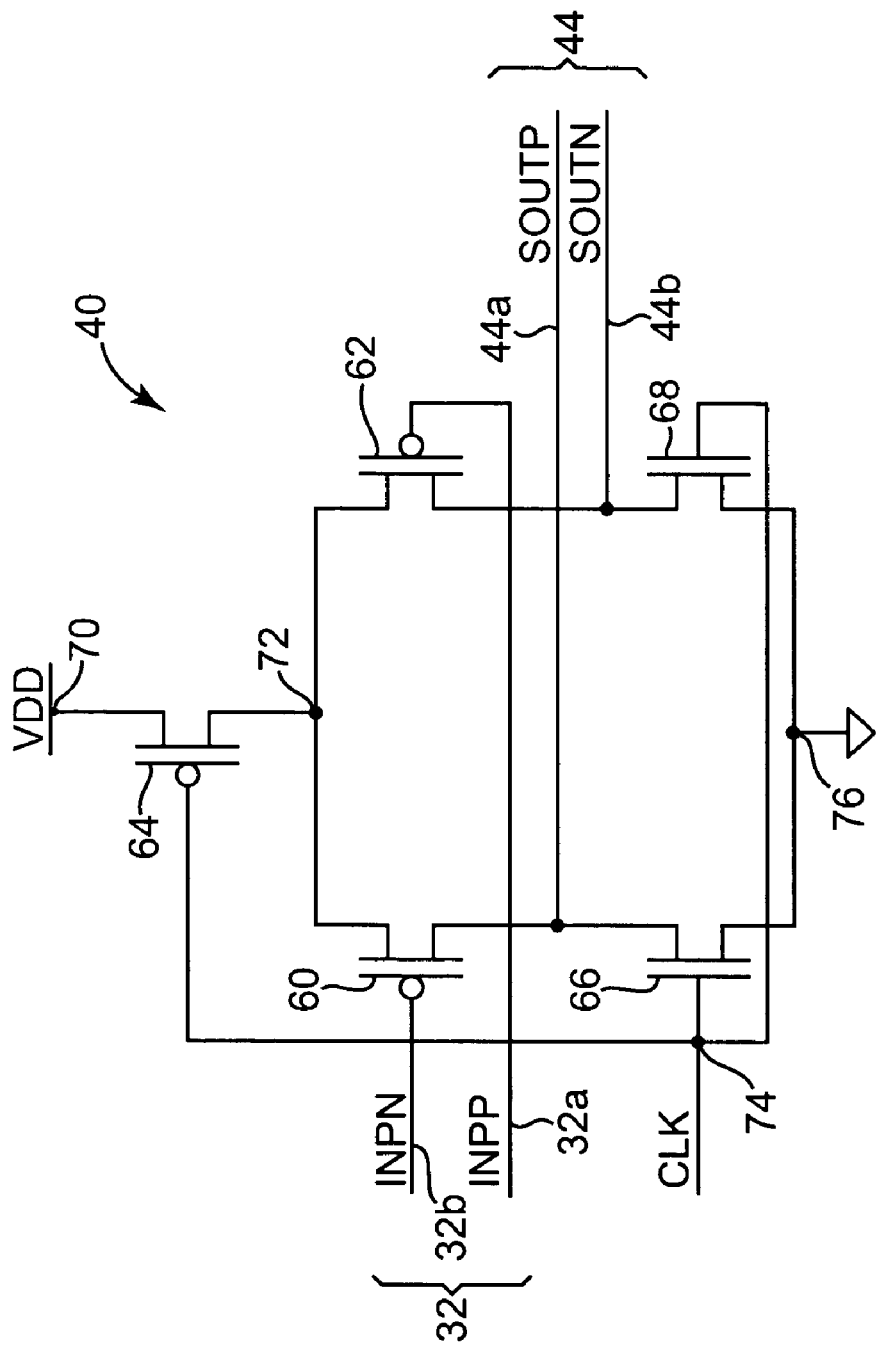
FIG. 3 is a diagram illustrating one embodiment of a first stage.

FIG. 3 is a diagram illustrating one embodiment of first stage 40, which is a PMOS-based clocked amplifier. First stage 40 receives differential input signals INPP at 32a and INPN at 32b via data communications path 32 and provides output signals SOUTP at 44a and SOUTN at 44b via output signal path 44. Input signals INPP at 32a and INPN at 32b have a low common mode voltage level, such as in CML and other ground referenced signals.

First stage 40 includes a differential pair of PMOS input transistors 60 and 62, a PMOS evaluation transistor 64, and two NMOS pre-charge transistors 66 and 68. The gate of first input transistor 60 receives input signal INPN at 32b and the gate of second input transistor 62 receives input signal INPP at 32a. One side of the drain-source path of evaluation transistor 64 is electrically coupled to power VDD at 70. The other side of the drain-source path of evaluation transistor 64 is electrically coupled at 72 to one side of the drain-source path of first input transistor 60 and one side of the drain-source path of second input transistor 62. The gate of evaluation transistor 64 receives clock signal CLK at 74.

The gate of first pre-charge transistor 66 and the gate of second pre-charge transistor 68 receive clock signal CLK at 74. One side of the drain-source path of first pre-charge transistor 66 is electrically coupled at 44a to the other side of the drain-source path of first input transistor 60. The other side of the drain-source path of first pre-charge transistor 66 is electrically coupled at 76 to a reference, such as ground. One side of the drain-source path of second pre-charge transistor 68 is electrically coupled at 44b to the other side of the drain-source path of second input transistor 62. The other side of the drain-source path of second pre-charge transistor 68 is electrically coupled at 76 to the reference.

In operation, if clock signal CLK at 74 is at a high voltage level, evaluation transistor 64 is biased off and pre-charge transistors 66 and 68 are biased on. Output signals SOUTP at 44a and SOUTN at 44b are discharged or pre-charged to a low voltage level that is substantially equal to the reference voltage level, such as ground, through pre-charge transistors 66 and 68. Also, the voltage at 72 discharges to substantially a low voltage level through input transistors 60 and 62 and pre-charge transistors 66 and 68. The high voltage level phase of clock signal CLK at 74 is referred to as the pre-charge period.

The falling edge of clock signal CLK at 74 triggers an evaluation period. During the evaluation period the input signals INPP at 32a and INPN at 32b are sampled to recover data information. As clock signal CLK at 74 transitions to a low voltage level, pre-charge transistors 66 and 68 are biased off and evaluation transistor 64 is biased on. Input signals INPP at 32a and INPN at 32b are differential signals that have a low common mode voltage. One of the input transistors 60 and 62 receives a lower gate voltage and is biased on stronger than the other one of the input transistors 60 and 62. The output signal SOUTP at 44a or SOUTN at 44b coupled to the input transistor 60 or 62 that is biased on stronger, charges or rises toward or substantially to a high voltage level at a faster edge rate than the output signal SOUTP at 44a or SOUTN at 44b coupled to the input transistor 60 or 62 that is biased off or biased on less. The difference between the rising edge rates in the output signals SOUTP at 44a and SOUTN at 44b corresponds to the difference between input signals INPP at 32a and INPN at 32b and to the sampled data information.

Output signals SOUTP at 44a or SOUTN at 44b rise to substantially the same high voltage level.

For example, if INPP at 32a is at a higher voltage level than INPN at 32b, input transistor 60 is biased on stronger than input transistor 62. Output signal SOUTP at 44a rises at a faster edge rate to the high voltage level through input transistor 60 and output signal SOUTN at 44b rises at a slower edge rate to the high voltage level through input transistor 62. Also, if INPP at 32a is at a lower voltage level than INPN at 32b, input transistor 62 is biased on stronger than input transistor 60. Output signal SOUTP at 44a rises at a slower edge rate to the high voltage level through input transistor 60 and output signal SOUTN at 44b rises at a faster edge rate to the high voltage level through input transistor 62. The difference between the edge rates in the output signals SOUTP at 44a and SOUTN at 44b corresponds to the difference between input signals INPP at 32a and INPN at 32b and to the sampled data information.

As clock signal CLK at 74 transitions to a high voltage level, first stage 40 enters the pre-charge period. Evaluation transistor 64 is biased off and pre-charge transistors 66 and 68 are biased on. Output signals SOUTP at 44a and SOUTN at 44b are pre-charged to the low voltage level that is substantially equal to the reference voltage level and the voltage at 72 discharges to a low voltage level through input transistors 60 and 62 and pre-charge transistors 66 and 68. Data sampling continues with the falling edge of clock signal CLK at 74.

The output signals SOUTP at 44a and SOUTN at 44b are received by second stage 42 via output signal path 44. Second stage 42 amplifies the difference between output signals SOUTP at 44a and SOUTN at 44b and provides regenerated output signals ROUT at 34. Latch 30 receives regenerated output signals ROUT at 34 and provides latched data output signals to subsystem assembly 24 via data output path 36.

Figures 4, 5:
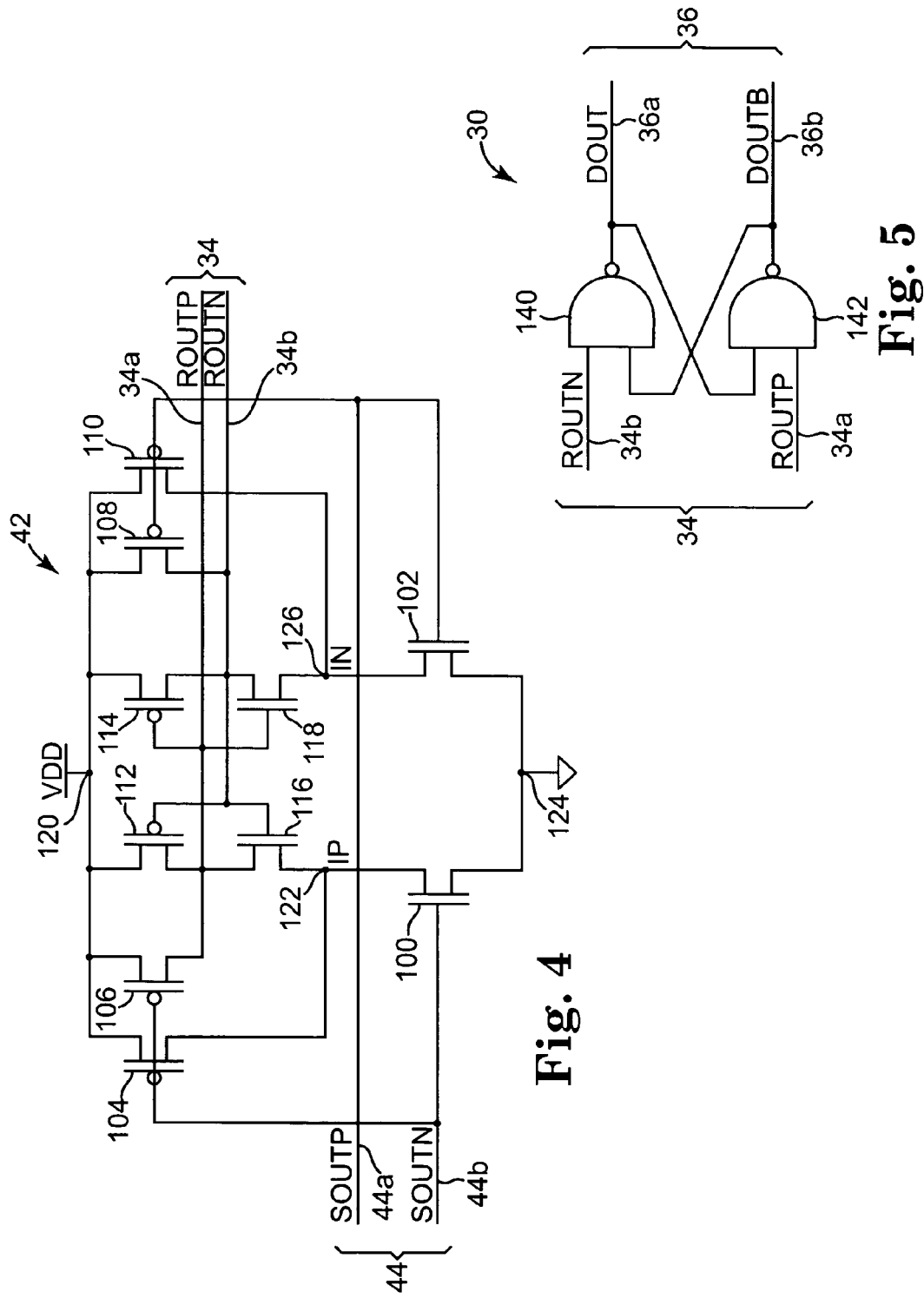
FIG. 4 is a diagram illustrating one embodiment of a second stage.
FIG. 5 is a diagram illustrating one embodiment of a latch.

FIG. 4 is a diagram illustrating one embodiment of second stage 42, which is a signal regenerative structure. Second stage 42 is electrically coupled to first stage 40 via output signal path 44. Second stage 42 receives output signals SOUTP at 44a and SOUTN at 44b from first stage 40 via output signal path 44. Second stage 42 is electrically coupled to another circuit, such as latch 30, via regenerated output signal path 34 and provides regenerated output signals ROUTP at 34a and ROUTN at 34b to the other circuit via regenerated output signal path 34. Regenerated output signals ROUTP at 34a and ROUTN at 34b have a higher common mode voltage level than differential input signals INPP at 32a and INPN at 32b. In one embodiment, second stage 42 provides signals in regenerated output signals ROUTP at 34a and ROUTN at 34b that drive complementary metal oxide semiconductor (CMOS) circuits.

Second stage 42 includes a differential pair of input transistors 100 and 102, pre-charge transistors 104, 106, 108, and 110, and regeneration transistors 112, 114, 116, and 118. Input transistors 100 and 102 and regeneration transistors 116 and 118 are NMOS transistors. Pre-charge transistors 104, 106, 108, and 110 and regeneration transistors 112 and 114 are PMOS transistors.

First regeneration transistor 112 and third regeneration transistor 116 are cross-coupled to second regeneration transistor 114 and fourth regeneration transistor 118. The drain-source paths of first regeneration transistor 112 and third regeneration transistor 116 are electrically coupled at 34a to the gates of second regeneration transistor 114 and fourth regeneration transistor 118 and provide regenerated output signal ROUTP at 34a. The drain-source paths of second regeneration transistor 114 and fourth regeneration transistor 118 are electrically coupled at 34b to the gates of first regeneration transistor 112 and third regeneration transistor 116 and provide regenerated output signal ROUTN at 34b.

In the cross-coupled transistors, one side of the drain-source path of first regeneration transistor 112 and one side of the drain-source path of second regeneration transistor 114 are electrically coupled to power VDD at 120. The other side of the drain-source path of first regeneration transistor 112 is electrically coupled at 34a to one side of the drain-source path of third regeneration transistor 116 and to the gates of second regeneration transistor 114 and fourth regeneration transistor 118. The other side of the drain-source path of second regeneration transistor 114 is electrically coupled at 34b to one side of the drain-source path of fourth regeneration transistor 118 and to the gates of first regeneration transistor 112 and third regeneration transistor 116.

The gate of first input transistor 100 is electrically coupled at 44b to the gate of first pre-charge transistor 104 and to the gate of second pre-charge transistor 106, all of which receive output signal SOUTN at 44b via output signal path 44. One side of the drain-source path of first pre-charge transistor 104 and one side of the drain-source path of second pre-charge transistor 106 are electrically coupled to power VDD at 120. The other side of the drain-source path of first pre-charge transistor 104 is electrically coupled at 122 to one side of the drain-source path of first input transistor 100 and to the other side of the drain-source path of third regeneration transistor 116. The other side of the drain-source path of second pre-charge transistor 106 is electrically coupled at 34a to the one side of the drain-source path of third regeneration transistor 116 and to the other side of the drain-source path of first regeneration transistor 112. The other side of the drain-source path of first input transistor 100 is electrically coupled to a reference, such as ground, at 124.

The gate of second input transistor 102 is electrically coupled at 44a to the gate of third pre-charge transistor 108 and to the gate of fourth pre-charge transistor 110, all of which receive output signal SOUTP at 44a via output signal path 44. One side of the drain-source path of third pre-charge transistor 108 and one side of the drain-source path of fourth pre-charge transistor 110 are electrically coupled to power VDD at 120. The other side of the drain-source path of fourth pre-charge transistor 110 is electrically coupled at 126 to one side of the drain-source path of second input transistor 102 and to the other side of the drain-source path of fourth regeneration transistor 118. The other side of the drain-source path of third pre-charge transistor 108 is electrically coupled at 34b to the one side of the drain-source path of fourth regeneration transistor 118 and to the other side of the drain-source path of second regeneration transistor 114. The other side of the drain-source path of second input transistor 102 is electrically coupled to the reference at 124.

In operation, if clock signal CLK at 74 (shown in FIG. 3) is at a high voltage level, output signals SOUTP at 44a and SOUTN at 44b are pre-charged to a low voltage level that is substantially equal to the reference voltage level. During the pre-charge period, second stage 42 receives the low voltage level output signals SOUTP at 44a and SOUTN at 44b and provides a first internal signal IP at 122, a second internal signal IN at 126, and regenerated output signals ROUTP at 34a and ROUTN at 34b based on the output signals SOUTP at 44a and SOUTN at 44b. The low voltage level output signal SOUTP at 44a biases off input transistor 102 and biases on pre-charge transistors 108 and 110. The low voltage level output signal SOUTN at 44b biases off input transistor 100 and biases on pre-charge transistors 104 and 106. First internal signal IP at 122 and second internal signal IN at 126 are pre-charged to substantially the same first high voltage level through pre-charge transistors 104 and 110. Regenerated output signals ROUTP at 34a and ROUTN at 34b are pre-charged to substantially the same second high voltage level through pre-charge transistors 106 and 108. The high voltage level regenerated output signals ROUTP at 34a and ROUTN at 34b bias on regeneration transistors 116 and 118 to substantially equalize the first and second high voltage levels. Regeneration transistors 112 and 114 are biased off via the high voltage regenerated output signals ROUTP at 34a and ROUTN at 34b.

The falling edge of clock signal CLK at 74 triggers the evaluation period and output signals SOUTP at 44a and SOUTN at 44b rise at different edge rates to substantially the same high voltage level. Output signal SOUTP at 44a rises at a first edge rate and output signal SOUTN at 44b rises at a second edge rate. The difference between the first edge rate and the second edge rate corresponds to the difference between input signals INPP at 32a and INPN at 32b and to the sampled data information.

Second stage 42 receives output signals SOUTP at 44a and SOUTN at 44b and provides a third edge rate in first internal signal IP at 122 and a fourth edge rate in second internal signal IN at 126 based on the difference between the first edge rate and the second edge rate. Second stage 42 amplifies the difference between the first edge rate and the second edge rate to provide the third edge rate and the fourth edge rate and to provide regenerated output signals ROUTP at 34a and ROUTN at 34b. Thus, the regenerated output signals ROUTP at 34a and ROUTN at 34b correspond to the difference between input signals INPP at 32a and INPN at 32b.

If the first edge rate in output signal SOUTP at 44a is greater than the second edge rate in output signal SOUTN at 44b, input transistor 102 is biased on before input transistor 100. Also, pre-charge transistors 108 and 110 are biased off before pre-charge transistors 104 and 106. In response, second internal signal IN at 126 begins to fall toward a low voltage level before first internal signal IP at 122 transitions toward substantially the same low voltage level. The fourth edge rate in second internal signal IN at 126 is greater than the third edge rate in first internal signal IP at 122.

Regeneration transistor 118 is biased on and regeneration transistor 114 is biased off via the high voltage level in regenerated output signal ROUTP at 34a and as second internal signal IN at 126 transitions to a low voltage level, regenerated output signal ROUTN at 34b transitions to a low voltage level. The low voltage level in regenerated output signal ROUTN at 34b biases off regeneration transistor 116 and biases on regeneration transistor 112, which maintains regenerated output signal ROUTP at 34a at a high voltage level. The faster first edge rate in output signal SOUTP at 44a results in a high voltage level in regenerated output signal ROUTP at 34a and a low voltage level in regenerated output signal ROUTN at 34b. The common mode voltage level of regenerated output signal ROUTP at 34a and regenerated output signal ROUTN at 34b is higher than the common mode voltage level of input signals INPP at 32a and INPN at 32b.

If the second edge rate in output signal SOUTN at 44b is greater than the first edge rate in output signal SOUTP at 44a, input transistor 100 is biased on before input transistor 102. Also, pre-charge transistors 104 and 106 are biased off before pre-charge transistors 108 and 110. In response, first internal signal IP at 122 begins to fall toward a low voltage level before second internal signal IN at 126 transitions toward substantially the same low voltage level. The third edge rate in first internal signal IP at 122 is greater than the fourth edge rate in second internal signal IN at 126.

Regeneration transistor 116 is biased on and regeneration transistor 112 is biased off via the high voltage level in regenerated output signal ROUTN at 34b and as first internal signal IP at 122 transitions to a low voltage level, regenerated output signal ROUTP at 34a transitions to a low voltage level. The low voltage level in regenerated output signal ROUTP at 34a biases off regeneration transistor 118 and biases on regeneration transistor 114, which maintains regenerated output signal ROUTN at 34b at a high voltage level. The faster second edge rate in output signal SOUTN at 44b results in a high voltage level in regenerated output signal ROUTN at 34b and a low voltage level in regenerated output signal ROUTP at 34a. Again, the common mode voltage level of regenerated output signal ROUTP at 34a and regenerated output signal ROUTN at 34b is higher than the common mode voltage level of input signals INPP at 32a and INPN at 32b.

As clock signal CLK at 74 transitions to a high voltage level, first stage 40 enters the pre-charge period and output signals SOUTP at 44a and SOUTN at 44b are pre-charged to the low voltage level that is substantially equal to the reference voltage level. Second stage 42 receives the low voltage level output signals SOUTP at 44a and SOUTN at 44b and pre-charges first internal signal IP at 122 and second internal signal IN at 126 to substantially the same first high voltage level through pre-charge transistors 104 and 110. Also, second stage 42 pre-charges regenerated output signals ROUTP at 34a and ROUTN at 34b to substantially the same second high voltage level through pre-charge transistors 106 and 108. The high voltage level regenerated output signals ROUTP at 34a and ROUTN at 34b bias on regeneration transistors 116 and 118 to substantially equalize the first and second high voltage levels and regeneration transistors 112 and 114 are biased off via the high voltage regenerated output signals ROUTP at 34a and ROUTN at 34b.

Data sampling is initiated by the falling edge of clock signal CLK at 74. The regenerated output signals ROUTP at 34a and ROUTN at 34b are received by another circuit, such as latch 30 that provides latched data output signals to subsystem assembly 24 via data output path 36.

FIG. 5 is a diagram illustrating one embodiment of a latch 30. Latch 30 is electrically coupled to second stage 42 via regenerated output signal path 34 and to subsystem assembly 24 via data output path 36. Latch 30 receives regenerated output signals ROUTP at 34a and ROUTN at 34b via regenerated output signal path 34 and provides data output signal DOUT at 36a and, its inverse, data bar output signal DOUTB at 36b to subsystem assembly 24 via data output path 36.

Latch 30 includes a first NAND gate 140 and a second NAND gate 142. The output of first NAND gate 140 is electrically coupled at 36a to an input of second NAND gate 142. The output of second NAND gate 142 is electrically coupled at 36b to an input of first NAND gate 140. First NAND gate 140 receives regenerated output signal ROUTN at 34b and data bar output signal DOUTB at 36b and provides data output signal DOUT at 36a. Second NAND gate 142 receives regenerated output signal ROUTP at 34a and data output signal DOUT at 36a and provides data bar output signal DOUTB at 36b.

In operation, regenerated output signals ROUTP at 34a and ROUTN at 34b are pre-charged to substantially the same high voltage level. During the pre-charge period, latch 30 maintains the values of data output signal DOUT at 36a and data bar output signal DOUTB at 36b. If data output signal DOUT at 36a is at a low voltage level, data bar output signal DOUTB at 36b is at a high voltage level. Also, if data output signal DOUT at 36a is at a high voltage level, data bar output signal DOUTB at 36b is at a low voltage level.

After clock signal CLK at 74 transitions to a low voltage level, one of the regenerated output signals ROUTP at 34a and ROUTN at 34b transitions to a low voltage level and the other stays at a high voltage level. During the evaluation period, latch 30 latches in data output signal DOUT at 36a and data bar output signal DOUTB at 36b. If regenerated output signal ROUTN at 34b transitions to a low voltage level and regenerated output signal ROUTP at 34a stays at a high voltage level, data output signal DOUT at 36a is set to a high voltage level and data bar output signal DOUTB at 36b is set to a low voltage level. If regenerated output signal ROUTP at 34a transitions to a low voltage level and regenerated output signal ROUTN at 34b stays at a high voltage level, data bar output signal DOUTB at 36b is set to a high voltage level and data output signal DOUT at 36a is set to a low voltage level.

As clock signal CLK at 74 transitions to a high voltage level, first stage 40 and second stage 42 enter the pre-charge period and latch 30 maintains the values of data output signal DOUT at 36a and data bar output signal DOUTB at 36b. Data sampling is initiated by the falling edge of clock signal CLK at 74.

Figure 6:
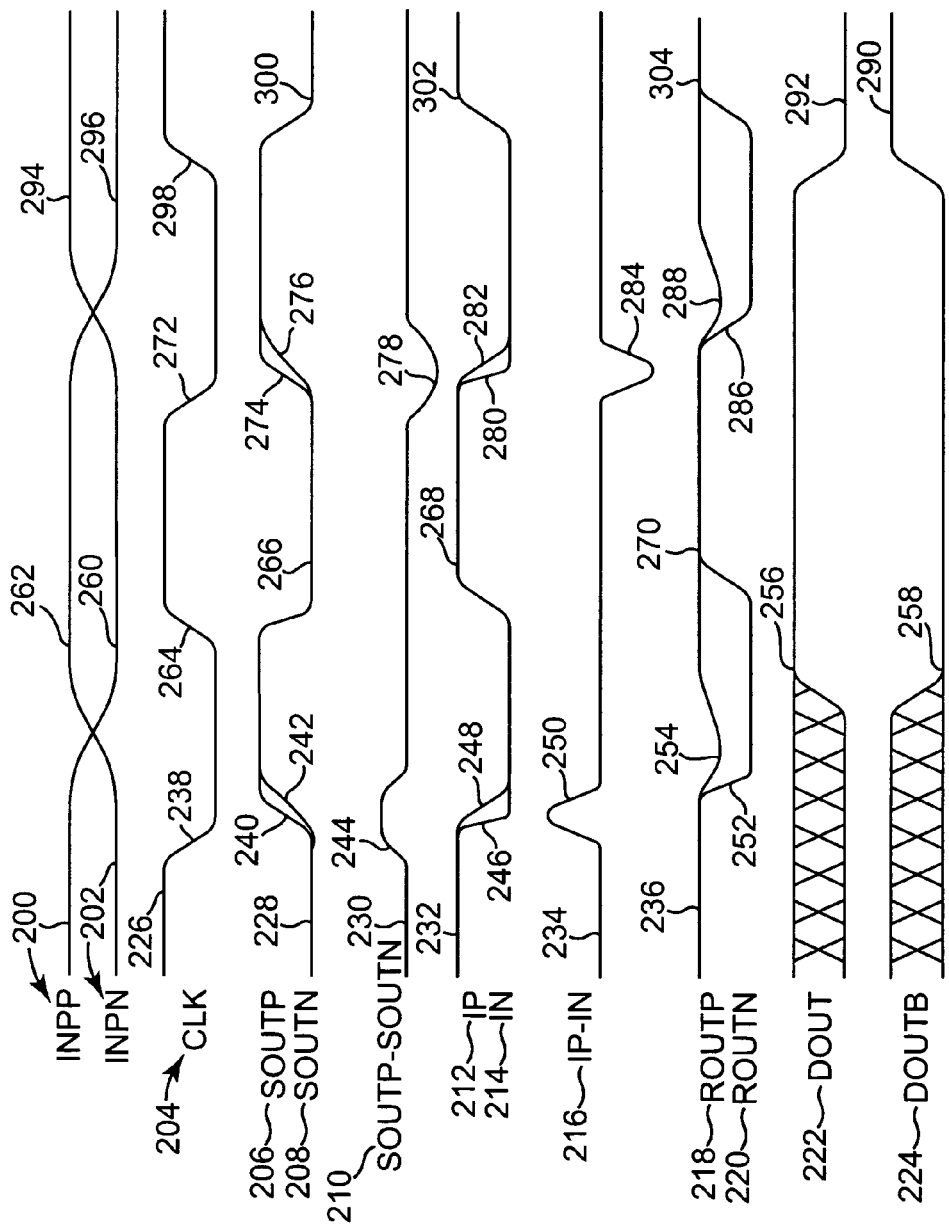
FIG. 6 is timing diagram illustrating operation of one embodiment of a data sampler and a latch.

FIG. 6 is a timing diagram illustrating operation of one embodiment of data sampler 28 and latch 30. First stage 40 of data sampler 28 receives differential input signals INPP at 200 and INPN at 202 via data communications path 32. Also, first stage 40 receives clock signal CLK at 204 and provides output signals SOUTP at 206 and SOUTN at 208 via output signal path 44. The difference of SOUTP-SOUTN at 210 is the difference between SOUTP at 206 and SOUTN at 208.

Second stage 42 receives output signals SOUTP at 206 and SOUTN at 208 from first stage 40 via output signal path 44 and provides first internal signal IP at 212 and second internal signal IN at 214. The difference of IP-IN at 216 is the difference between IP at 212 and IN at 214. Second stage 42 provides regenerated output signals ROUTP at 218 and ROUTN at 220 to latch 30 via regenerated output signal path 34. Latch 30 receives regenerated output signals ROUTP at 218 and ROUTN at 220 via regenerated output signal path 34 and provides data output signal DOUT at 222 and, its inverse, data bar output signal DOUTB at 224 to subsystem assembly 24 via data output path 36.

In the pre-charge period, clock signal CLK at 204 is at a high voltage level at 226, which biases off evaluation transistor 64 and biases on pre-charge transistors 66 and 68. Output signals SOUTP at 206 and SOUTN at 208 are pre-charged to the low voltage level at 228 through pre-charge transistors 66 and 68. The difference of SOUTP-SOUTN at 210 is substantially zero at 230.

Second stage 42 receives the low voltage level output signals SOUTP at 206 and SOUTN at 208 that bias off input transistors 100 and 102 and bias on pre-charge transistors 104, 106, 108, and 110. First internal signal IP at 212 and second internal signal IN at 214 are pre-charged to substantially the same high voltage level at 232 through pre-charge transistors 104 and 110. The difference of IP-IN at 216 is substantially zero at 234. Also, regenerated output signals ROUTP at 218 and ROUTN at 220 are pre-charged to substantially the same high voltage level at 236 through pre-charge transistors 106 and 108.

Latch 30 receives the high voltage levels in regenerated output signals ROUTP at 218 and ROUTN at 220 and maintains the values of data output signal DOUT at 222 and data bar output signal DOUTB at 224. If data output signal DOUT at 222 is at a low voltage level, data bar output signal DOUTB at 224 is at a high voltage level. Also, if data output signal DOUT at 222 is at a high voltage level, data bar output signal DOUTB at 224 is at a low voltage level.

At 238, the falling edge of clock signal CLK at 204 triggers the evaluation period. As clock signal CLK at 204 transitions to a low voltage level at 238, pre-charge transistors 66 and 68 are biased off and evaluation transistor 64 is biased on. INPP at 200 is at a higher voltage level than INPN at 202, which biases on input transistor 60 more than input transistor 62. Output signal SOUTP at 206 rises first at 240 and at a faster edge rate to the high voltage level through input transistor 60 and output signal SOUTN at 208 rises second at 242 and at a slower edge rate to the high voltage level through input transistor 62. The difference of SOUTP-SOUTN at 210 is a pulse at 244.

The first edge rate at 240 in output signal SOUTP at 206 is greater than the second edge rate at 242 in output signal SOUTN at 208 and input transistor 102 is biased on before input transistor 100. Also, pre-charge transistors 108 and 110 are biased off before pre-charge transistors 104 and 106. In response, second internal signal IN at 214 begins to fall first at 246 toward the low voltage level and first internal signal IP at 212 transitions second at 248 toward substantially the same low voltage level. The fourth edge rate 246 in second internal signal IN at 214 is greater than the third edge rate at 248 in first internal signal IP at 212. The difference of IP-IN at 216 is a pulse at 250 that has a magnitude greater than the pulse at 244.

As second internal signal IN at 214 transitions to a low voltage level at 246, regenerated output signal ROUTN at 220 transitions to a low voltage level at 252. Regenerated output signal ROUTP at 218 dips at 254 and the low voltage level in regenerated output signal ROUTN at 220 biases off regeneration transistor 116 and biases on regeneration transistor 112 to maintain regenerated output signal ROUTP at 218 at a high voltage level.

Latch 30 receives regenerated output signal ROUTN at 220 that transitions to a low voltage level at 252 and regenerated output signal ROUTP at 218 that stays at a high voltage level at 254. Data output signal DOUT at 222 is set to a high voltage level at 256 and data bar output signal DOUTB at 224 is set to a low voltage level at 258. The high voltage level in INPP at 200, results in a high voltage level at 256 in data output signal DOUT at 222 and a low voltage level at 258 in data bar output signal DOUTB at 224.

Input signal INPP at 200 switches to a lower voltage level at 260 and input signal INPN at 202 switches to a higher voltage level at 262. Clock signal CLK at 204 transitions to a high voltage level at 264 and data sampler 28 enters the pre-charge period. Evaluation transistor 64 is biased off and pre-charge transistors 66 and 68 are biased on to pre-charge output signals SOUTP at 206 and SOUTN at 208 to a low voltage level at 266. Second stage 42 pre-charges first internal signal IP at 212 and second internal signal IN at 214 to substantially the same high voltage level at 268 and second stage 42 pre-charges regenerated output signals ROUTP at 218 and ROUTN at 220 to substantially the same high voltage level at 270. Latch 30 maintains the high voltage level at 256 in data output signal DOUT at 222 and the low voltage level at 258 in data bar output signal DOUTB at 224. Data sampling is initiated by the falling edge at 272 of clock signal CLK at 204.

As clock signal CLK at 204 transitions to a low voltage level at 272, pre-charge transistors 66 and 68 are biased off and evaluation transistor 64 is biased on. INPP at 200 is at a lower voltage level at 260 and INPN at 202 is at a higher voltage level at 262 such that input transistor 62 is biased on more than input transistor 60. Output signal SOUTN at 208 rises first at 274 at a faster edge rate to the high voltage level and output signal SOUTP at 206 rises second at 276 at a slower edge rate to the high voltage level. The difference of SOUTP-SOUTN at 210 is a negative pulse at 278.

The second edge rate at 274 in output signal SOUTN at 208 is greater than the first edge rate at 276 in output signal SOUTP at 206 and input transistor 100 is biased on before input transistor 102. Also, pre-charge transistors 104 and 106 are biased off before pre-charge transistors 108 and 110. In response, first internal signal IP at 212 begins to fall toward a low voltage level at 280 before second internal signal IN at 214 transitions toward substantially the same low voltage level at 282. The third edge rate at 280 in first internal signal IP at 212 is greater than the fourth edge rate at 282 in second internal signal IN at 214. The difference of IP-IN at 216 is a negative pulse at 284 that has a magnitude greater than the negative pulse at 278.

As first internal signal IP at 212 transitions to a low voltage level at 280, regenerated output signal ROUTP at 218 transitions to a low voltage level at 286. Regenerated output signal ROUTN at 220 dips at 288 and the low voltage level in regenerated output signal ROUTP at 218 biases off regeneration transistor 118 and biases on regeneration transistor 114 to maintain regenerated output signal ROUTN at 220 at the high voltage level.

Latch 30 receives regenerated output signal ROUTP at 218 that transitions to a low voltage level at 286 and regenerated output signal ROUTN at 220 that stays at a high voltage level at 288. Data bar output signal DOUTB at 224 is set to a high voltage level at 290 and data output signal DOUT at 222 is set to a low voltage level at 292. The low voltage level at 260 in INPP at 200 and the high voltage level at 262 in INPN at 202, results in a low voltage level at 292 in data output signal DOUT at 222 and a high voltage level at 290 in data bar output signal DOUTB at 224.

Input signal INPP at 200 switches to a higher voltage level at 294 and input signal INPN at 202 switches to a lower voltage level at 296. Clock signal CLK at 204 transitions to a high voltage level at 298 and data sampler 28 enters the pre-charge period. Evaluation transistor 64 is biased off and pre-charge transistors 66 and 68 are biased on to pre-charge output signals SOUTP at 206 and SOUTN at 208 to a low voltage level at 300. Second stage 42 pre-charges first internal signal IP at 212 and second internal signal IN at 214 to substantially the same high voltage level at 302 and second stage 42 pre-charges regenerated output signals ROUTP at 218 and ROUTN at 220 to substantially the same high voltage level at 304. Latch 30 maintains the low voltage level at 292 in data output signal DOUT at 222 and the high voltage level at 290 in data bar output signal DOUTB at 224. Data sampling is initiated again by the next falling edge of clock signal CLK at 204.

Figure 7:
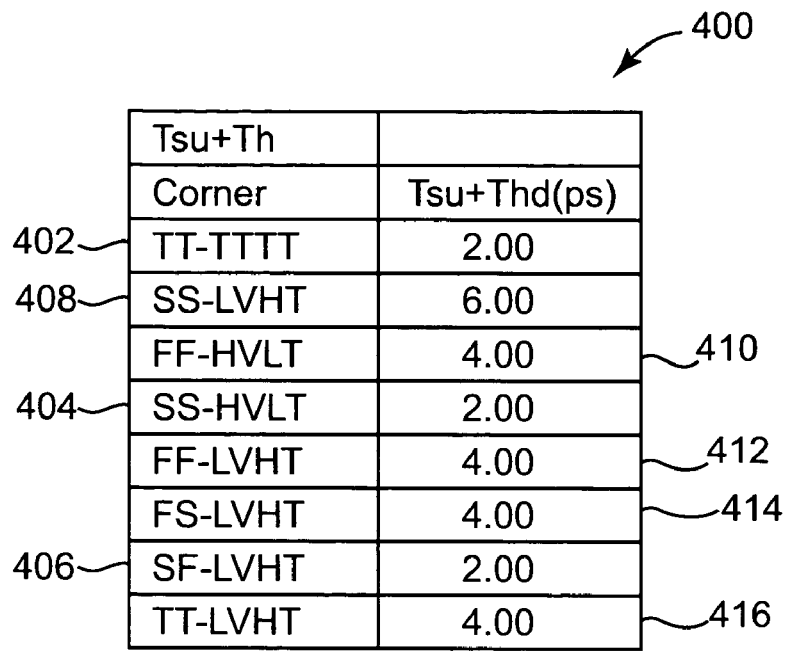
FIG. 7 is a process, voltage, and temperature (PVT) corner analysis table for the setup time plus the hold time of a two stage data sampler.

FIG. 7 is a process, voltage, and temperature (PVT) corner analysis table 400 for the setup time Tsu plus the hold time Th of the two stage data sampler 28. The setup time Tsu is the amount of time that the input signals INPP at 32$a$ and INPN at 32$b$ need to be valid before the falling edge of clock signal CLK at 74 for reliable operation of data sampler 28. The hold time Th is the amount of time that the input signals INPP at 32$a$ and INPN at 32$b$ need to be held after the falling edge of clock signal CLK at 74 for reliable operation of data sampler 28.

In table 400, the first two letters in the left hand column indicate the speed of NMOS and PMOS devices, where the first letter indicates the speed of NMOS devices and the second letter indicates the speed of PMOS devices. The letter T indicates a typical speed, S a slow speed, and F a fast speed. The last four letters in the left hand column indicate the voltage and temperature settings, where the first two of the last four letters indicate the voltage setting and the last two of the last four letters indicate the temperature setting. The letters TT indicate a typical voltage of 1.0 volts or a typical temperature setting, LV a low voltage setting of 0.9 volts, HV a high voltage setting of 1.1 volts, LT a low temperature setting of 0 degrees Celsius, and HT a high temperature setting of 125 degrees Celsius.

The input signals INPP at 32a and INPN at 32b were provided at a 160 milli-volt (mv), differential peak to peak voltage swing and an input edge rate of 40 pico-seconds (ps). The data rate is 8.0 gigabits per second (Gb/s) with an input jitter of zero. The common mode voltage level of input signals INPP at 32a and INPN at 32b is equal to the reference voltage VSS plus 0.25 volts. A typical VDD is 1.0 volt, which includes noise of 40 mv peak to peak from 20 mega-hertz (MHz) to 1 giga-hertz (GHz).

The setup plus hold time Tsu+Th ranges from 2 ps to 6 ps over PVT changes indicated in corner analysis table 400. At 402, where the PVT parameters are typical including typical NMOS speeds, typical PMOS speeds, a typical voltage, and a typical temperature (TT-TTTT), the setup plus hold time Tsu+Th is a minimum of 2 ps. Also, the setup plus hold time Tsu+Th is 2 ps at the slow NMOS, slow PMOS, high voltage, and low temperature (SS-HVLT) corner at 404. In addition, the setup plus hold time Tsu+Th is 2 ps at the slow NMOS, fast PMOS, low voltage, and high temperature (SF-LVHT) corner at 406. The setup plus hold time Tsu+Th is 6 ps at the slow NMOS, slow PMOS, low voltage, and high temperature (SS-LVHT) corner at 408. The setup plus hold time Tsu+Th is 4 ps at the other corners of 410, 412, 414, and 416.

The setup plus hold time Tsu+Th of data sampler 28 is about one half the setup plus hold time of an NMOS one stage data sampler. At 8 GHz, where one data bit is 125 ps and a 35% data eye results in a data eye of 43.75 ps, a reduction in the setup plus hold time of up to 6 ps can improve reliability of the system employing data sampler 28.

Figure 8:
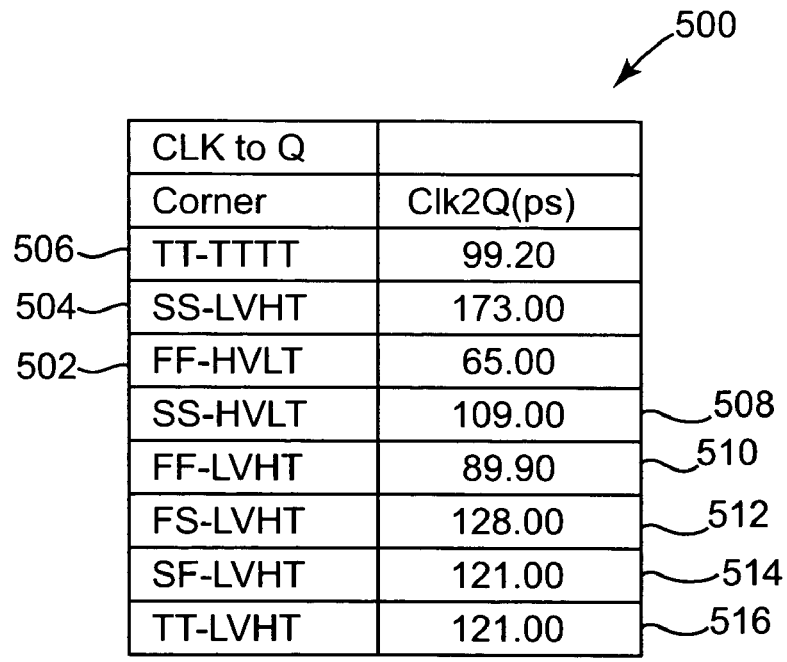
FIG. 8 is a PVT corner analysis table for the time from the edge of a clock signal to the output of a data sampler.

FIG. 8 is a PVT corner analysis table 500 for the time from the edge of clock signal CLK to regenerated output signals ROUTP at 34a and ROUTN at 34b (CLK to Q). In table 500, the first two letters in the left hand column indicate the speed of NMOS and PMOS devices, where the first letter indicates the speed of NMOS devices and the second letter indicates the speed of PMOS devices. The letter T indicates a typical speed, S a slow speed, and F a fast speed. The last four letters in the left hand column indicate the voltage and temperature settings, where the first two of the last four letters indicate the voltage setting and the last two of the last four letters indicate the temperature setting. The letters TT indicate a typical voltage of 1.0 volts or a typical temperature setting, LV a low voltage setting of 0.9 volts, HV a high voltage setting of 1.1 volts, LT a low temperature setting of 0 degrees Celsius, and HT a high temperature setting of 125 degrees Celsius.

The input signals INPP at 32a and INPN at 32b were provided at a 160 milli-volt (mv) differential peak to peak voltage swing and an input edge rate of 40 pico-seconds (ps). The data rate is 8.0 gigabits per second (Gb/s) with an input jitter of zero. The common mode voltage level of input signals INPP at 32a and INPN at 32b is equal to the reference voltage VSS plus 0.25 volts. A typical VDD is 1.0 volts and includes noise of 40 mv peak to peak from 20 mega-hertz (MHz) to 1 giga-hertz (GHz). The load is 100 femto-farads (fF).

The CLK to Q time of data sampler 28 ranges from 65 ps to 173 ps over PVT changes indicated in corner analysis table 500. At 502, the CLK to Q time is 65 ps at the fast NMOS, fast PMOS, high voltage, and low temperature (FF-HVLT) corner. The CLK to Q time is 173 ps at the slow NMOS, slow PMOS, low voltage, and high temperature (SS-LVHT) corner at 504. At 506, where the PVT parameters are typical including typical NMOS speeds, typical PMOS speeds, a typical voltage, and a typical temperature (TT-TTTT), the CLK to Q time is 99.2 ps. The CLK to Q time is between the minimum value of 65 ps and the maximum value of 173 ps at the other corners of 408, 410, 412, 414, and 416. The CLK to Q time of data sampler 28 is substantially comparable to the CLK to Q time of an NMOS one stage data sampler.

Data sampler 28, provides reduced setup plus hold times Tsu+Th and CLK to Q times that are substantially comparable to the CLK to Q times of an NMOS one stage data sampler. Also, data sampler 28 is configured to receive input signals INPP at 32a and INPN at 32b that have a low common mode voltage level, such as CML signals and other ground referenced signals. Level shifters are not needed to raise the common mode voltage level of input signals INPP at 32a and INPN at 32b. Thus, data sampler 28 reduces power needs and is especially useful in low voltage and/or low power applications.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A data sampler comprising:
   a first stage configured to receive differential signals and provide, based on the differential signals, a signal transition having a first edge rate in a first output signal and a signal transition having a second edge rate in a second output signal, wherein the first edge rate is different than the second edge rate; and
   a second stage configured to amplify the difference between the first output signal and the second output signal to provide regenerated output signals, wherein the second stage provides, based on the first edge rate and the second edge rate, a signal transition having a third edge rate in a first internal signal and a signal transition having a fourth edge rate in a second internal signal;
   wherein the first output signal and the second output signal are pre-charged to a first voltage during one state of a clock signal and the first internal signal and the second internal signal are pre-charged to a second voltage in response to the pre-charged first output signal and the pre-charged second output signal.

2. The data sampler of claim 1, wherein the first output signal and the second output signal transition to a third voltage in response to an edge of the clock signal and the first internal signal and the second internal signal transition to a fourth voltage in response to the transitions of the first output signal and the second output signal.

3. The data sampler of claim 1, wherein the difference between the first edge rate and the second edge rate is a first pulse that has a first magnitude and the difference between the third edge rate and the fourth edge rate is a second pulse that has a second magnitude, wherein the absolute value of the second magnitude is greater than the absolute value of the first magnitude.

4. The data sampler of claim 1, wherein the first stage is configured to evaluate the differential signals in response to a single clock signal edge.

5. The data sampler of claim 1, wherein the differential signals are ground referenced differential signals.

6. An electronic system comprising:
a sampler configured to receive differential signals and provide regenerated output signals, wherein the sampler comprises:
- a first stage configured to receive the differential signals and provide, based on the differential signals, a first output signal with a signal transition having a first edge rate and a second output signal with a signal transition having a second edge rate, wherein the first edge rate is different than the second edge rate; and
- a second stage configured to receive the first output signal and the second output signal and provide a first internal signal and a second internal signal based on the first output signal and the second output signal, wherein the first output signal and the second output signal are pre-charged to a first voltage during one state of a clock signal and the first internal signal and the second internal signal are pre-charged to a second voltage based on the pre-charged first output signal and the pre-charged second output signal.

7. The electronic system of claim 6, wherein the first stage is configured to provide transitions in the first output signal and the second output signal during an evaluation period in response to an edge of the clock signal.

8. The electronic system of claim 7, wherein the second stage is configured to provide transitions in the first internal signal and the second internal signal during the evaluation period and in response to the transitions in the first output signal and the second output signal.

9. The electronic system of claim 6, wherein the second stage is configured to provide the regenerated output signals based on the difference between the first internal signal and the second internal signal.

10. The electronic system of claim 6, comprising:
a latch configured to receive the regenerated output signals and provide at least one data output signal.

11. The electronic system of claim 6, wherein the second stage is configured to provide, based on the first edge rate and the second edge rate, a signal transition having a third edge rate in the first internal signal and a signal transition having a fourth edge rate in the second internal signal.

12. A data sampler comprising:
means for receiving differential signals at a first stage;
means for providing, based on the differential signals, a first output signal with a signal transition having a first edge rate and a second output signal with a signal transition having a second edge rate, wherein the first edge rate is different than the second edge rate;
means for pre-charging the first output signal and the second output signal to a first voltage based on a clock signal;
means for receiving the first output signal and the second output signal at a second stage;
means for providing a first internal signal and a second internal signal based on the first output signal and the second output signal; and
means for pre-charging the first internal signal and the second internal signal to a second voltage based on the pre-charged first output signal and the pre-charged second output signal.

13. The data sampler of claim 12, comprising:
means for amplifying the difference between the first internal signal and the second internal signal to provide regenerated output signals; and
means for latching the regenerated output signals to provide at least one data output signal.

14. The data sampler of claim 12, wherein the means for providing a first internal signal and a second internal signal comprises:
means for providing, based on the first edge rate and the second edge rate, a signal transition having a third edge rate in the first internal signal and a signal transition having a fourth edge rate in the second internal signal.

15. A data sampler comprising:
means for receiving differential signals at a first stage;
means for providing, based on the differential signals, a signal transition having a first edge rate in a first output signal and a signal transition having a second edge rate in a second output signal, wherein the first edge rate is different than the second edge rate;
means for receiving the first output signal and the second output signal at a second stage; and
means for providing, based on the first edge rate and the second edge rate, a signal transition having a third edge rate in a first internal signal and a signal transition having a fourth edge rate in a second internal signal;
wherein the means for providing a signal transition having a first edge rate in a first output signal and a signal transition having a second edge rate in a second output signal comprises:
means for pre-charging the first output signal and the second output signal to a first voltage based on a clock signal; and
means for transitioning the first output signal and the second output signal to a second voltage in response to an edge of the clock signal.

16. The data sampler of claim 15, wherein the means for providing a signal transition having a third edge rate in a first internal signal and a signal transition having a fourth edge rate in a second internal signal comprises:
means for pre-charging the first internal signal and the second internal signal to a third voltage in response to the pre-charged first output signal and the pre-charged second output signal; and
means for transitioning the first internal signal and the second internal signal to a fourth voltage in response to the transitioned first output signal and the transitioned second output signal.

17. A method for sampling data comprising:
receiving differential signals at a first stage;
pre-charging a first output signal and a second output signal to a first voltage based on a clock signal;
pre-charging a first internal signal and a second internal signal to a second voltage based on the pre-charged first output signal and the pre-charged second output signal;
transitioning, based on the differential signals, the first output signal at a first edge rate and the second output signal at a second edge rate, wherein the first edge rate is different than the second edge rate;
receiving the first output signal and the second output signal at a second stage; and
transitioning the first internal signal and the second internal signal based on the first output signal and the second output signal.

18. The method of claim 17, comprising:
amplifying the difference between the first internal signal and the second internal signal to provide regenerated output signals; and
latching the regenerated output signals to provide at least one data output signal.

19. The method of claim 17, wherein transitioning the first internal signal and the second internal signal comprises:
providing a signal transition having a third edge rate in the first internal signal and a signal transition having a fourth edge rate in the second internal signal based on the first edge rate and the second edge rate.

20. A method for sampling data comprising:
receiving differential signals at a first stage;
providing, based on the differential signals, a signal transition having a first edge rate in a first output signal and a signal transition having a second edge rate in a second output signal, wherein the first edge rate is different than the second edge rate;
receiving the first output signal and the second output signal at a second stage; and
providing a signal transition having a third edge rate in a first internal signal and a signal transition having a fourth edge rate in a second internal signal based on the first edge rate and the second edge rate;
wherein providing a signal transition having a first edge rate in a first output signal and a signal transition having a second edge rate in a second output signal comprises:
pre-charging the first output signal and the second output signal to a first voltage based on a clock signal; and
transitioning the first output signal and the second output signal to a second voltage in response to an edge of the clock signal.

21. The method of claim 20, wherein providing a signal transition having a third edge rate in a first internal signal and a signal transition having a fourth edge rate in a second internal signal comprises:
pre-charging the first internal signal and the second internal signal to a third voltage in response to the pre-charged first output signal and the pre-charged second output signal; and
transitioning the first internal signal and the second internal signal to a fourth voltage in response to the transitioned first output signal and the transitioned second output signal.

* * * * *